United States Patent [19]

Brewer, Jr.

[11] Patent Number: 5,132,611
[45] Date of Patent: Jul. 21, 1992

[54] AUTOMOBILE GAUGE REPAIR

[76] Inventor: Ben E. Brewer, Jr., P.O. Box 1823, Andrews, Tex. 79314

[21] Appl. No.: 323,688

[22] Filed: Mar. 15, 1989

[51] Int. Cl.⁵ .......................... G01R 1/20; G01R 1/30
[52] U.S. Cl. ................................... 324/157; 324/126; 324/511; 324/537
[58] Field of Search .............. 324/157, 511, 537, 126; 338/49; 439/890, 883, 830, 845, 849

[56] References Cited

U.S. PATENT DOCUMENTS

| | | | |
|---|---|---|---|
| 1,951,799 | 3/1934 | Lederer | 324/126 |
| 3,060,349 | 10/1962 | Brady et al. | 439/890 X |

FOREIGN PATENT DOCUMENTS 233841  5/1925  United Kingdom ................ 439/883

*Primary Examiner*—Kenneth A. Wieder
*Attorney, Agent, or Firm*—Wendell Coffee

[57] ABSTRACT

A defective automobile gauge is repaired by placing a resistance across the back of the gauge. At least 95% of the automobile gauges which fail do so because the regular resistance shunt has opened. The regular resistance shunt is mounted upon a ceramic plate that is necessary for the structural support of the galvanometer of the gauge. Therefore, the ceramic plate with the defective resistance remains in place and additional resistance is attached in parallel with the defective resistance.

2 Claims, 1 Drawing Sheet

AUTOMOBILE GAUGE REPAIR

RIGHTS TO INVENTIONS UNDER FEDERAL RESEARCH

There was no federally sponsored research and development concerning this invention.

BACKGROUND OF THE INVENTION (1) Field of the Invention

This invention relates to the repair of motorized vehicles such as automotive gauges such as the oil pressure gauge, fuel gauge, and temperature gauge. An automobile repair mechanic is one having ordinary skill in this art.

(2) Description of the Problem and Related Art

Basically, all automobile gauges are shunted galvanometers which are calibrated for the appropriate reading. For example the measurements of oil pressure, temperature, or fuel level will be translated into an electrical output, and then the measurement of this electrical output will indicate on the dashboard of the automobile as to whether the fuel is full or half full, or whether the oil pressure is 15 pounds or 30 pounds.

One common form of galvanometers used as gauges on automobiles use, as a shunt, a ceramic plate with a resistance material on the back of the plate. The ceramic plate is rectangular and has a hole near each end of it. Bolts or studs extend from the back of the meter having two electrical connections to the meter. The holes in the plate telescope over these electrical connecting studs. Upon the back of the plate is painted the resistance material with an insulating cover also painted over the resistance material. The portion of resistance material surrounding the holes of the plate are not insulated so that an electrical connection is made at those two points.

It has been found that often the resistance material fails and the resistance separates, resulting in an open circuit. This causes a malfunction of the gauge. Normally, this occurs with the ceramic plate intact. The ceramic plate is a structural part of the meter as well as an electrical part of the electrical circuit of the meter.

In commercial practice, the ceramic plates are not available as a repair part. Therefore, when the resistance paint on the ceramic plate fails, the repair mechanic must replace the entire gauge.

SUMMARY OF THE INVENTION (1) Progressive Contribution to the Art

I have discovered that 95% of the failures of the gauges of the type described above are due to an open circuit through the shunt.

From this conclusion, I have invented a simple way of repairing that problem; namely, to place a common resistor having the same resistance of the original ceramic plate between the two electrical stud connections of the meter.

The electrically damaged ceramic plate is left in place because it is structurally sound and is needed as a portion of the meter.

(2) Objects of this Invention

An object of this invention is to repair gauges upon automobiles.

Further objects are to achieve the above with devices that are sturdy, compact, durable, lightweight, simple, safe, efficient, versatile, ecologically compatible, energy conserving, and reliable, yet inexpensive and easy to manufacture, install, and maintain.

Other objects are to achieve the above with a method that is rapid, versatile, ecologically compatible, energy conserving, efficient, and inexpensive, and does not require skilled people to install and maintain.

The specific nature of the invention, as well as other objects, uses, and advantages thereof, will clearly appear from the following description and from the accompanying drawing, the different views of which are not scale drawings.

Figure 1:
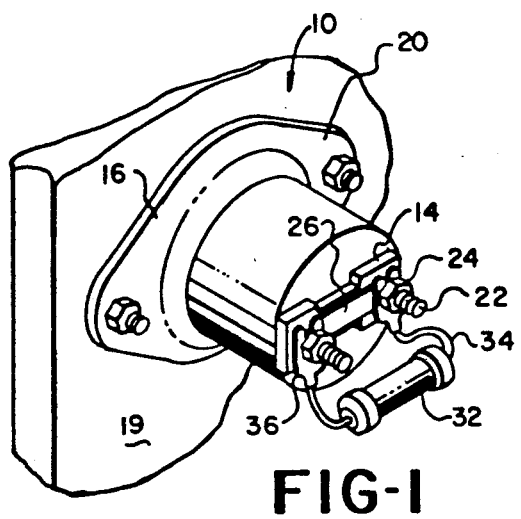
FIG. 1 is a rear perspective view of a repaired meter in place behind the dash.
Figure 2:
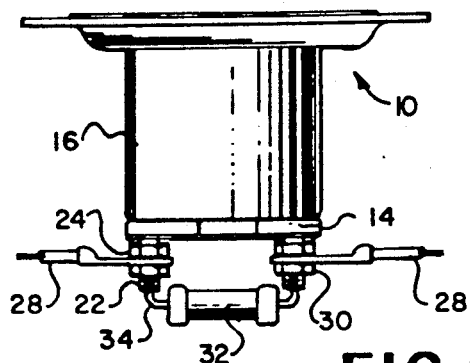
FIG. 2 is a top plan view of a repaired gauge in place behind the dash.
Figure 3:
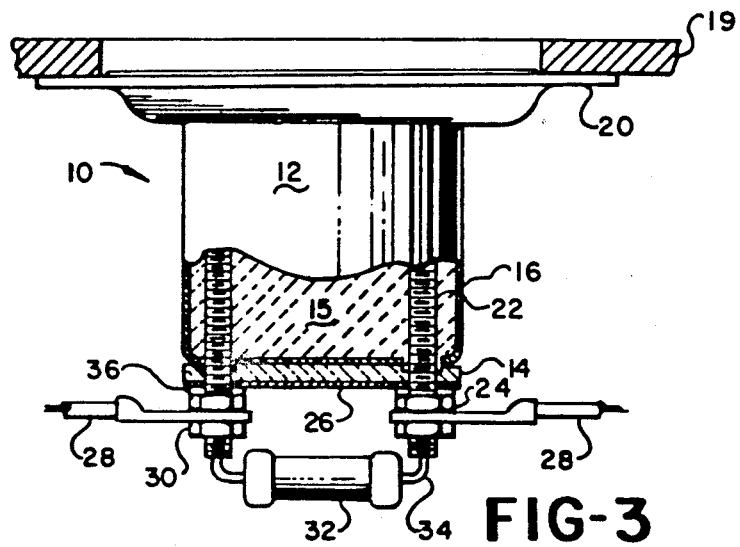
FIG. 3 is an axial section of the gauge with details of the galvanometer omitted for clarity.
Figure 4:
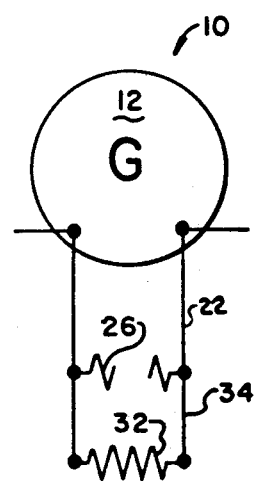
FIG. 4 is a schematic representation of the repaired gauge.
Figure 5:
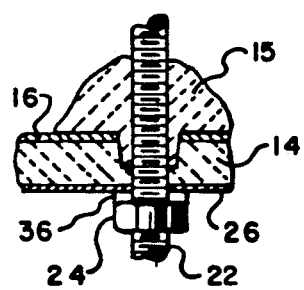
FIG. 5 is an enlarged sectional view of a portion of FIG. 3.

As an aid to correlating the terms of the claims to the exemplary drawing, the following catalog of elements is provided:

| | |
|---|---|
| 10 | gauge |
| 12 | galvanometer |
| 14 | plate |
| 15 | frame |
| 16 | housing |
| 19 | dash |
| 20 | ears |
| 22 | electrical bolt |
| 24 | nuts |
| 26 | plate shunt |
| 28 | electrical wires |
| 30 | electrical nuts |
| 32 | repair resistor |
| 34 | leads |
| 36 | spade connectors |

DESCRIPTION OF THE PREFERRED EMBODIMENT

Referring to the drawings, there may be seen gauge 10. The gauge 10 includes galvanometer 12 and ceramic plate 14 which forms a structural portion of the gauge 10. The plate 14 holds frame 15 of the galvanometer 12 to housing 16. Two structural bolts or studs (not shown for clarity) extend from the rear housing 16. The structural bolts may hold the gauge to dash 19 in some installations. In other cases, the gauge may be held to the dash by ears 20 upon the housing 16. The term "dash" is used to include all instrument panels of motor vehicles.

Also, two electrical studs or bolts 22 extend from the frame 15 through the housing 16 at the back of the gauge 10. Although the bolts are identified as electrical bolts 22, they also form a structural portion of the gauge. The plate 14 is attached both electrically and structurally to the gauge 10 by nuts 24 on bolts 22. The nuts contact the painted electrical resistance shunt 26 at the back. The nuts 24 also hold the plate 14 securely to the housing 16. Since the bolts or studs 22 are secured to the frame 15 of the galvanometer 12, they will also hold the frame of the galvanometer to the housing 16. Also, those having ordinary skill in the art will realize that other electrical conductors wires 28 are connected to the electrical bolts 22 by electrical nuts 30.

Those having ordinary skill in the art will understand that the description to this point is well known, and the equipment described to this point has been commercially on the market for many years.

When the resistant shunt 26 fails, the gauge 10 will malfunction. To repair it, a repair resistor 32 is connected between the electrical bolts 22.

It is preferred that the repair resistance be a heavy duty resistance so it will structurally and physically withstand rough handling in transportation in application. I prefer to use a resistance that is painted upon a ceramic base, the ceramic base having a diameter of about 6 mm and a length of about 15.5 mm. To this, a lead 34 having at least a diameter of 0.8 mm is used. I find that heavy duty resistors of this quality will withstand the rough treatment of insulation by ordinary automobile repair mechanics and dissipate the heat.

In preparing the resistors, first the resistors are painted to place another coat of protection over the resistance on the outer surface of the ceramic body. Also, the paint identifies them as a repair resistor. After this, the ends are clipped to a uniform length. Thereafter, spade connectors 36 are crimped to the leads 34. The prepared resistors are then packaged as a repair kit.

To install the repair resistor 32, first the automobile mechanic releases the gauge. By the term "releases the gauge", it is meant that if the gauges are held to the dash by ear 20 upon the housing 16, the ears may be released and the gauge pulled forward from the dash to expose the resistor shunt on the back which is defective. If the gauge is mounted by structural studs 18 at the rear, it is necessary to disconnect the dash 19 from the body of the automobile and pull the dash forward. When the dash is pulled forward, this is considered to be a releasing step exposing the open resistor shunt 26 on the back of the gauge 10.

Once the plate 14 with the open resistor shunt is exposed, the electrical nuts 30 may be loosened and the electrical wires 28 removed. Then the nuts 24 can be loosened. With the nuts 24 loosened, the spade connectors 36 on the leads 34 of the repair resistor 32 are inserted between the nuts 24 and the ceramic plate 14. With the spade connectors in that position, the nuts 24 are tightened, thereby clamping the housing 16 between the frame 15 and the plate 14. Also, the spade connectors 36 will be clamped between the nuts 24 and the ceramic plate 14. Thereafter, the electrical wires 28 are again replaced, and the electrical nuts 30 are tightened to make the electrical connection. Thereafter, the gauge 10 is replaced. it is either reinserted into the dash if it was front mounted, or the dash, itself, is again connected to the body of the automobile if it were back mounted.

Thus it may be seen that I have provided an inexpensive, rapid method of repair which does not require skilled people.

The embodiment shown and described above is only exemplary. I do not claim to have invented all the parts, elements or steps described. Various modifications can be made in the construction, material, arrangement, and operation, and still be within the scope of my invention.

The restrictive description and drawing of the specific examples above do not point out what an infringement of this patent would be, but are to enable one skilled in the art to make and use the invention. The limits of the invention and the bounds of the patent protection are measured by and defined in the following claims.

I claim as my invention:

1. A process of repairing a gauge on the dash of a motor vehicle having:
    a. a galvanometer,
    b. an open resistor shunt electrically connected in parallel to to said galvanometer,
    c. a housing around said galvanometer, and
    d. a ceramic plate
        i. structurally supporting said open resistor shunt, and
        ii. connecting said galvanometer to said housing by
        iii. bolts on said galvanometer,
        iv. holes in said ceramic plate telescoped over said bolts, and
        v. nuts holding said plate to said housing,
    e. said process comprising the steps of:
    f. releasing said gauge thereby
    g. exposing the open resistor shunt,
    h. loosening said nuts,
    i. inserting spade connector of a repair resistor between said nuts and said ceramic plate,
    j. tightening said nuts, and
    k. replacing said gauge.
2. The structure of
    a. a motor vehicle dash supporting
    b. a repaired gauge which includes
        i. a galvanometer,
        ii. a galvanometer frame,
        iii. a housing,
        iv. mounting means on the gauge for mounting the galvanometer frame to the dash,
        v. two bolts on said galvanometer frame extending outward through the housing,
        vi. a ceramic plate forming a portion of the connection of the galvanometer frame to the housing and also a support for a defective resistor shunt,
        vii. holes in the ceramic plate,
        viii. said bolts inserted through said holes, and
        ix. a nut on each of the bolts clamping said housing between the plate and frame;
    c. wherein the improvement comprises:
    d. a repair resistor having
        i. two leads,
        ii. a spade connector on each of the leads,
    e. one of said spade connectors between each of the nuts and the ceramic plate.

* * * * *